United States Patent
Patel et al.

(10) Patent No.: US 8,779,816 B2
(45) Date of Patent: Jul. 15, 2014

(54) LOW AREA ALL DIGITAL DELAY-LOCKED LOOP INSENSITIVE TO REFERENCE CLOCK DUTY CYCLE AND JITTER

(71) Applicant: Conexant Systems, Inc., Irvine, CA (US)

(72) Inventors: Santosh Patel, Hyderabad (IN); Pradeep Anantula, Hyderabad (IN)

(73) Assignee: Conexant Systems, Inc., Irvine, CA (US)

( * ) Notice: Subject to any disclaimer, the term of this patent is extended or adjusted under 35 U.S.C. 154(b) by 0 days.

(21) Appl. No.: 13/919,973

(22) Filed: Jun. 17, 2013

(65) Prior Publication Data

US 2013/0342251 A1    Dec. 26, 2013

Related U.S. Application Data

(60) Provisional application No. 61/662,228, filed on Jun. 20, 2012.

(51) Int. Cl.
*H03L 7/06* (2006.01)
*H03L 7/08* (2006.01)

(52) U.S. Cl.
CPC .................................... *H03L 7/08* (2013.01)
USPC ..................................... 327/158; 327/149

(58) Field of Classification Search
CPC ..... H03L 7/0814; H03L 7/0812; G11C 7/222
USPC ................................................. 327/149, 158
See application file for complete search history.

(56) References Cited

U.S. PATENT DOCUMENTS

| | | | |
|---|---|---|---|
| 6,642,760 B1* | 11/2003 | Alon et al. | 327/158 |
| 7,825,710 B2 | 11/2010 | Kim et al. | |
| 2004/0046597 A1* | 3/2004 | Alon et al. | 327/278 |
| 2006/0017480 A1* | 1/2006 | Lin | 327/158 |
| 2011/0221495 A1 | 9/2011 | Lee et al. | |
| 2011/0316599 A1* | 12/2011 | Kwak | 327/158 |
| 2013/0342251 A1* | 12/2013 | Patel et al. | 327/158 |

OTHER PUBLICATIONS

Garlepp, B., et al; A Portable Digital DLL for High-Speed CMOS Interface Circuits; IEEE Journal of Solid-State Circuits, vol. 34, No. 5, May 1999, pp. 632-644.

* cited by examiner

*Primary Examiner* — Adam Houston
(74) *Attorney, Agent, or Firm* — Jackson Walker L.L.P.; Christopher J. Rourk

(57) ABSTRACT

A circuit comprising 1) a master delay-locked loop comprising a phase detector for receiving a reference clock and generating an output, control logic for receiving the output from the phase detector and a delta delay input and generating a control output, a clock splitter for receiving the reference clock and generating differential clock output, a delay line for receiving the differential reference clock from the clock splitter and generating n phases of differential reference clock at output, a multiplexer for receiving the output from the delay line and the control logic output and generating a clock output, wherein the phase detector is for receiving the reference clock, and 2) a slave delay-locked loop for receiving the control logic output and a strobe input and generating a delay locked loop output.

20 Claims, 2 Drawing Sheets

LOW AREA ALL DIGITAL DELAY-LOCKED LOOP INSENSITIVE TO REFERENCE CLOCK DUTY CYCLE AND JITTER

RELATED APPLICATIONS

The present applications claims priority to U.S. provisional patent application No. 61/662,228, filed Jun. 20, 2012, which is hereby incorporated by reference for all purposes as if set forth herein in its entirety.

TECHNICAL FIELD

The present disclosure relates to delay-locked loops, and more specifically to an all digital delay-locked loop insensitive to reference clock duty cycle and jitter.

BACKGROUND OF THE INVENTION

A delay-locked loop (DLL) is used in various applications, such as in a double data rate (DDR) memory interface to provide a fixed delay that is insensitive to process, voltage and temperature variations. The delay-locked loop can be implemented using digital or analog circuitry.

SUMMARY OF THE INVENTION

A circuit comprising 1) a master delay-locked loop having a phase detector for receiving a reference clock and generating an output, control logic for receiving the output from the phase detector and a delta delay input and generating a control output, a clock splitter for receiving the reference clock and generating differential clock output, a delay line for receiving the differential reference clock from the clock splitter and generating n phases of differential reference clock at output, and a multiplexer for receiving the output from the delay line and the control logic output and generating a clock output, wherein the phase detector is for receiving the reference clock, and 2) a slave delay-locked loop for receiving the control logic output and a strobe input and generating a delay locked loop output.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
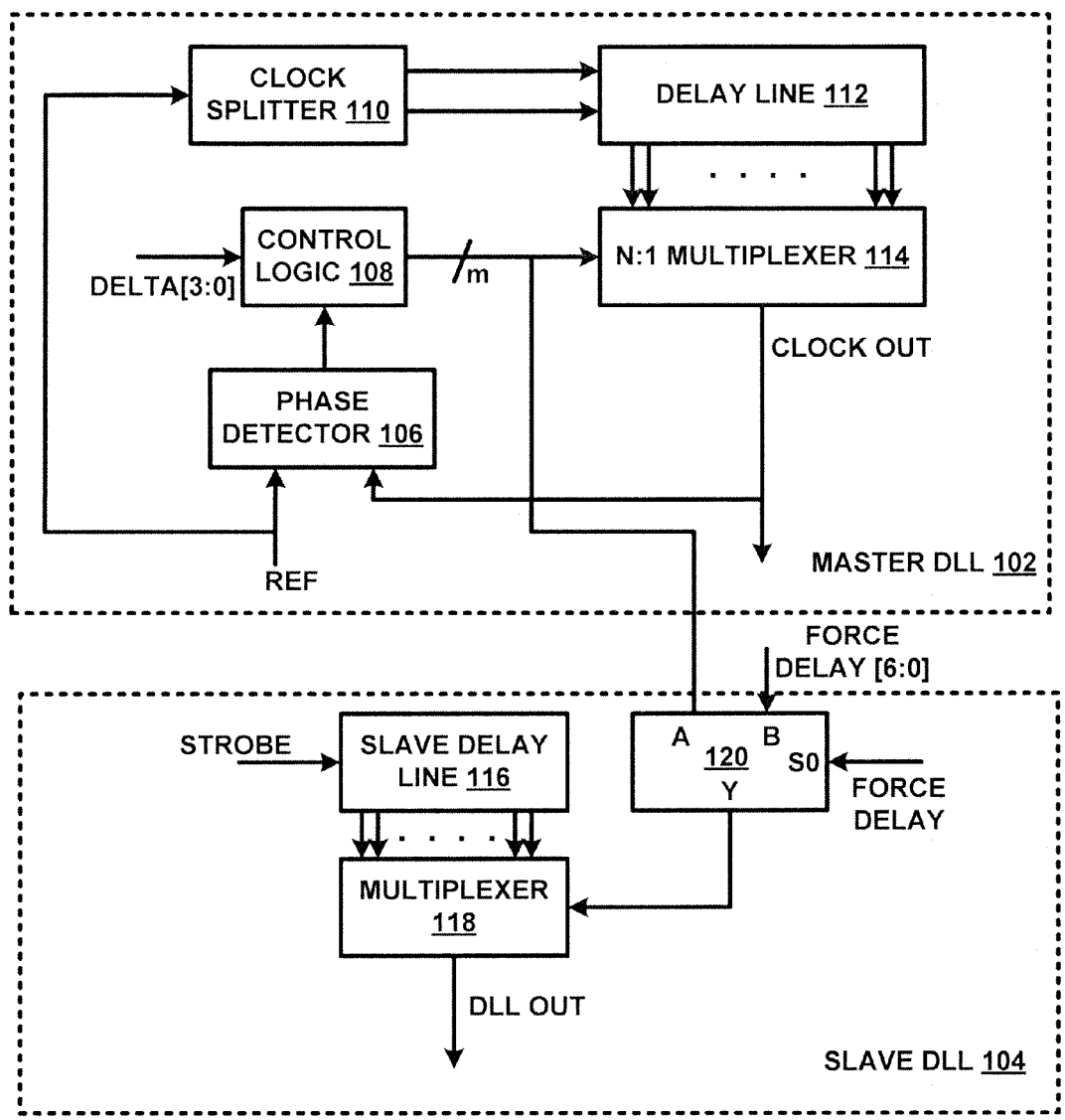
FIG. 1 is a diagram of a system for providing a delay locked loop in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

The purpose of a delay-locked loop (DLL) in a double data rate (DDR) memory interface is to provide a process/temperature/supply independent delay to the strobe signal so that it is 90 degrees out of phase with its corresponding data signals. The delayed strobe signal is used to re-time the input data in the read path. For a DLL in a DDR memory interface, digital implementations are preferred over analog implementations, as design portability is easier with a digital implementation. For a DDR interface, a master-slave configuration can be used. In the master DLL, the reference clock can be passed through a tapped delay line. The DLL selects the tap which is in phase with the reference clock and corresponds to the 360 degrees delay. The selected tap number in the master DLL is then divided by four and given as a control word to the slave DLL, which corresponds to 90 degrees of the reference clock cycle.

In a conventional DLL, the master DLL can have sufficient taps corresponding to one full clock cycle of the reference clock. Also, the propagation delay of the phase selection multiplexer in the slave DLL can be exactly one-fourth of the propagation delay of phase selection multiplexer in the master DLL, which necessitates the need of dummy multiplexers. A mechanism to indicate the first 180 degrees of phase shift is also necessary. This implementation consumes a large core area inside the physical layer. Significant area can be saved if the selected DLL tap aligns with the falling edge of the reference clock that corresponds to 180 degrees delay, but degradation in the reference clock duty, which should ideally be 50 percent, can result in a static phase error in the delay provided.

One problem with existing DLLs is that the phase detector window width and master delay chain step size (coarse delay) are set to multiples (k and j respectively) of the slave delay chain step size (fine delay). An alignment block is added to continually center the reference clock edge in the PD window. The combined changes reduce jitter-induced delay fluctuations without significantly degrading the tracking of supply and temperature variations.

Another problem is that the DLL control logic consists of an asynchronous binary search circuit (ABS) for quickly determining the control word, a first-edge detector (FED) for generating the required signals for the ABS, a timing control unit (TCU) for controlling the operation phase, and components for path selection and delay balancing. Unlike conventional DLLs, the disclosed delay line is not divided into a coarse section and a fine section, but constructed with binary weighted differential-delay cells (BWDCs), which are designed to work in accordance with the ABS for achieving design goals. After being released from the reset state, the ABS begins to convert the phase delay between the internal and external clocks into a binary-weighted control code. Only the first pulses of the external clock and the internal clock are extracted by the FED to be fed to the ABS. During the operation of the ABS, the internal clock will be suppressed. After up-loading the obtained control word into the counter, the ABS will be disabled in order to save power.

Another problem with prior solutions is that the DLL in a locked state selected the tap which was in phase with the reference clock corresponding to the 360 degrees delay. The delay line was implemented as dual, pseudo-differential delay lines using simple CMOS inverters. Each of the two delay lines provided only 180' of delay, and because complementary signals were used, the delay lines had to be tapped at every delay element output. The phase in the delay lines was measured by an end-of-cycle (HOC) detector, which was a timing digitizer implemented by a series of D flip-flops clocked by the input signal and connected to the output of every other delay element along the two delay lines. The detector produced a thermometer code whose first binary transition indicates the first 180' of phase shift in the delay lines. These prior art approaches required more components and area to implement.

The present disclosure provides a unique approach to significantly reduce the area consumed and can also make the DLL insensitive to the reference clock duty cycle. By using clk2x of the DDR physical layer as a reference clock and aligning the DLL tap to the falling edge, a significant savings in area in terms of delay lines as well as a phase selection multiplexer is achieved. The present disclosure also includes a technique to make the DLL performance insensitive to the duty cycle degradation of the reference clock. Having a small area provides the flexibility of placing the DLL either in the core or in the pad ring.

FIG. 1 is a diagram of a system 100 for providing a delay locked loop in accordance with an exemplary embodiment of the present disclosure. System 100 can be implemented in hardware or a suitable combination of hardware and software.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

System 100 includes master DLL 102 and slave DLL 104. Master DLL 102 includes phase detector 106, which receives a reference clock REF and an output from N:1 multiplexer 114 and generates an output to control logic 108. Control logic 108 also receives a delta delay [3:0] input and generates selection data for n:1 multiplexer 114. Clock splitter 110 receives the reference clock REF and outputs a differential reference clock signal to delay line 112. The clk2x of the DDR physical layer, which has twice the frequency of the strobe, is used as the reference clock REF for master DLL 102. In the lock state, the falling edge of the reference clock is phase aligned with the rising edge of the selected DLL tap, which corresponds to only a half cycle of the reference clock. The selected tap number in the locked state of master DLL 102 is given as a control word to the slave DLL 104 from the output of control logic 108. Since the strobe frequency is one half of the reference clock REF, this control word effectively corresponds to a one-quarter delay of the strobe frequency, which is essentially the requirement for the DDR interface applications. In this manner, the length of delay line 116 and the area consumed is significantly reduced. The area consumed by the phase selection multiplexer 114 is also significantly reduced, as it requires half the number of inputs, and no dummy multiplexers are needed because the selected tap number is same as the control word provided to slave DLL 104. This exemplary embodiment is dependent on the duty cycle of the reference clock, which should ideally be 50 percent. Any deviation from the ideal duty cycle of reference clock would result in a static phase error when DLL is in the locked state. A technique to overcome this is also disclosed.

In one exemplary embodiment, system 100 employs pseudo differential delay lines. The locking operation of master DLL 102 can happen in two phases. In the first phase, the first half cycle of the reference clock cycle is aligned and the generated tap number is stored. In the second phase, the second half cycle of the reference clock is aligned. The tap numbers generated in two phases of the locking operation are averaged and then given as a control word to slave DLL 104. In this manner, the average tap number generated always corresponds to one half cycle of the reference clock cycle irrespective of its duty cycle. Control logic 108 generates the lock signal when the locking operation is complete and the generated control word can be used by slave DLL 104.

As previously mentioned, the disclosed DLL is very efficient in terms of area and power consumption. The extremely low area occupied by the DLL provides the flexibility to integrate it inside the pad ring without impacting the core area. In addition, the DLL is insensitive to the reference clock duty cycle, such that the routing constraints on the reference clock are very relaxed. The disclosed DLL also has a delta delay programmability to manually provide an incremental/decremental adjustment to the generated delay to compensate for any board/timing related skews. In previous solutions, for end of cycle detection, a D flip flop needed to be placed at the output of every other tap along the delay line, which required a large area and increased power consumption.

Figure 2:
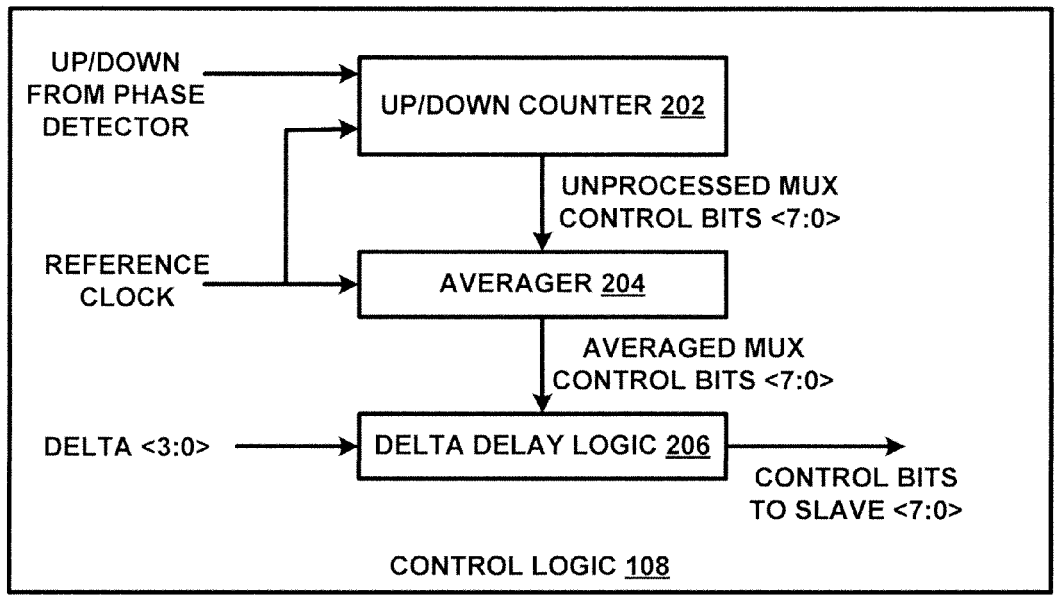
FIG. 2 is a diagram of control logic for a DLL in accordance with an exemplary embodiment of the present disclosure.

FIG. 2 is a diagram of control logic 200 for a DLL in accordance with an exemplary embodiment of the present disclosure. Control logic 200 includes up/down counter 202, averager 204 and delta delay logic 206, each of which can be implemented in hardware or a suitable combination of hardware and software.

High speed interfaces can use DLLs to generate fixed delays of a fraction of a clock cycle for synchronizing clocks and data, and for other suitable purposes. While digital implementations are preferred over the analog implementations, digital implementations are susceptible to jitter on the reference clock causing loss of accuracy of the delay generated. High jitter on the reference clock leads to large delay variations on the delay generated by the DLL and results in timing errors in the subsequent data paths.

The present disclosure provides a unique approach to compensate for the reference clock jitter by making the DLL tolerant to large jitter on the reference clock, thereby relaxing the otherwise stringent requirements on the DLL reference clock so that system jitter budget is not affected by the DLL requirements.

In a conventional all digital DLL, the delay line generates the evenly phased spaces of the reference clock. The phases are fed to an n:1 phase selection multiplexer, the selection bits for which are generated from the control logic. The control logic consists of a D flip flop based bang bang phase detector, which takes the reference clock and delay reference clock as its inputs and provides the increment/decrement signals to an up/down counter whose value corresponds to the selection bits of the phase selection multiplexer. The phase detector window is one delay wide and the delayed reference clock transitions in that window in the locked state. It has been determined that this conventional design is susceptible to the jitter between the reference clock and the delayed reference, which potentially causes the phase detector to toggle. The up/down counter toggles between a wide range of values proportional to the amount of reference clock jitter and the delay number does not converge to an accurate value.

In the present disclosure, up/down counter 202 receives an up/down signal from phase detector 106 and the reference clock. Averager 204 is initiated after the initial phase alignment is done. The initiation signal can be generated by a lock counter or in other suitable manners, and the unprocessed or raw multiplexer control bits are provided to averager 204 by up/down counter 202 at the rate of the control clock. Averager 204 can be implemented as a low latency 16 bit carry look ahead adder and an accumulator. Averager 204 provides the averaged multiplexer control bits to delta delay logic 206, which then provides the control bits to slave DLL 104.

Figure 3:
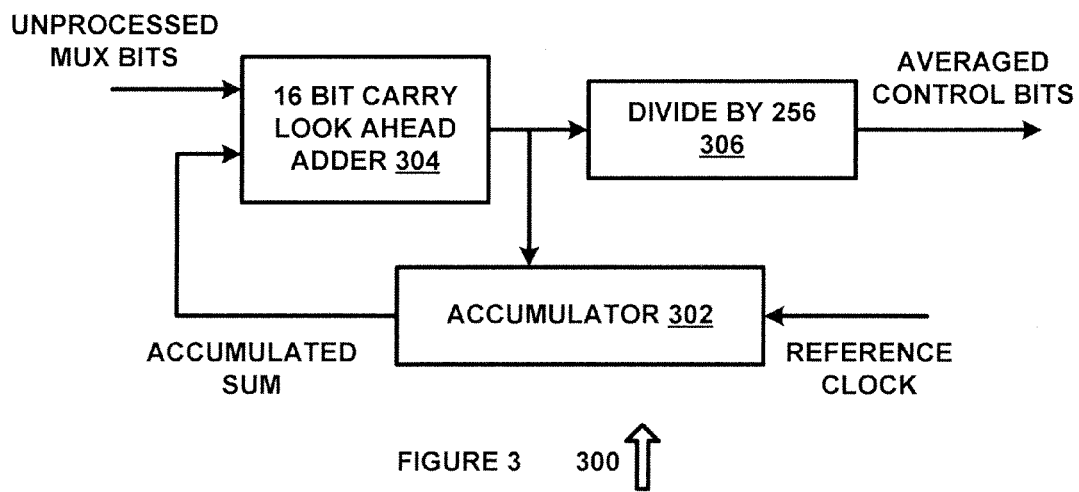
FIG. 3 is a diagram of an averaging circuit in accordance with an exemplary embodiment of the present disclosure.

FIG. 3 is a diagram of an averaging circuit 300 in accordance with an exemplary embodiment of the present disclosure. Averaging circuit 300 include accumulator 302, 16 bit carry look ahead adder 304 and divide by 256 circuit 306. Accumulator 302 can be implemented as a bank of 16 D flip flops clocked by the reference clock. At every rising edge of the reference clock cycle which has the same frequency as the reference clock, the cumulative sum of the tap values since the previous cycle is fed to 16 bit carry look ahead adder 304. The other input to 16 bit carry look ahead adder 304 can include the unprocessed multiplexer bits (tap value) of the current cycle. This process continues for 256 clock cycles and the cumulative sum at the end of 256 cycles is divided by 256 using divide by 256 circuit 306 and the resulting averaged control bit value is fed to the slave DLL as the control word.

The present disclosure is thus very efficient in terms of area and power consumption and is easy to implement. The logic can be embedded in the control logic of the master DLL and requires no modifications to the conventional delay line architecture. In addition, the logic is easily scalable for various frequency ranges of reference clocks/data rates. Unlike prior approaches, where the master DLL requires a delay line whose resolution is a multiple of the slave delay line resolution, which thereby increases its area as well as power, the present disclosure does not impose such requirements. Prior approaches also required a phase detector alignment circuit and control circuitry for changing the scaling factor of master delay line delay and phase detector window width, which is complex, and which is also not required using the present disclosure. Prior approaches also used binary weighted delay cells and circuitry to implement an asynchronous binary search algorithm, which is complex and which is also not required using the present disclosure.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:
1. A circuit comprising:
a master delay-locked loop comprising:
a phase detector configured to receive a reference clock and an internal clock output and to generate a phase detector output;
control logic configured to receive the phase detector output and a delay input and to generate a control output;
a clock splitter configured to receive the reference clock and to generate a differential clock output;
a delay line configured to receive the differential clock output and to generate a delayed differential clock output; and
a multiplexer configured to receive the delayed differential clock output and the control output and to generate the internal clock output; and
a slave delay-locked loop configured to receive the control output and a strobe input and to generate a delay locked loop output.

2. The circuit of claim 1 wherein the control logic comprises an up/down counter configured to receive an input from the phase detector and the reference clock and to generate a multiplexer control signal.

3. The circuit of claim 1 wherein the control logic comprises an averager configured to receive an input from the reference clock and a multiplexer control signal and to generate an averaged multiplexer control signal.

4. The circuit of claim 1 wherein the control logic comprises a delay configured to receive a delay signal and an averaged multiplexer control signal and to generate the control signal.

5. The circuit of claim 1 wherein the control logic comprises:
an up/down counter configured to receive an input from the phase detector and the reference clock and to generate a multiplexer control signal;
an averager configured to receive an input from the reference clock and the multiplexer control signal and to generate an averaged multiplexer control signal; and
a delay configured to receive a delay signal and the averaged multiplexer control signal and to generate the control signal.

6. The circuit of claim 3 wherein the averager comprises an accumulator configured to receive the reference clock and to generate an accumulated sum.

7. The circuit of claim 3 wherein the averager comprises a 16 bit carry look-ahead adder configured to receive a multiplexer control signal and an accumulated sum and to generate an adder output.

8. The circuit of claim 7 wherein the averager further comprises a divide by 256 circuit configured to receive the adder output and to generate an averaged multiplexer control signal.

9. The circuit of claim 3 wherein the averager comprises:
an accumulator configured to receive the reference clock and to generate an accumulated sum;
a 16 bit carry look-ahead adder configured to receive a multiplexer control signal and the accumulated sum and to generate an adder output; and
a divide by 256 circuit configured to receive the adder output and to generate an averaged multiplexer control signal.

10. A circuit comprising:
a master delay-locked loop comprising:
a phase detector configured to receive a reference clock and an internal clock output and to generate a phase detector output; and control logic configured to receive the phase detector output and a delay input and to generate a control output; and a slave delay-locked loop configured to receive the control output and a strobe input and to generate a delay locked loop output.

11. The circuit of claim 10 wherein the master delay locked loop further comprises a clock splitter configured to receive the reference clock and to generate a differential clock output.

12. The circuit of claim 11 wherein the master delay locked loop further comprises a delay line configured to receive the differential clock output and to generate a delayed differential clock output.

13. The circuit of claim 12 wherein the master delay locked loop further comprises a multiplexer configured to receive the delayed differential clock output and the control output and to generate the internal clock output and the control logic comprises an up/down counter configured to receive an input from the phase detector and the reference clock and to generate a multiplexer control signal, and an averager configured to receive an input from the reference clock and a multiplexer control signal and to generate an averaged multiplexer control signal.

14. The circuit of claim 10 wherein the control logic comprises a delay configured to receive a delay signal and an averaged multiplexer control signal and to generate the control signal.

15. The circuit of claim 10 wherein the control logic comprises:
   an up/down counter configured to receive an input from the phase detector and the reference clock and to generate a multiplexer control signal;
   an averager configured to receive an input from the reference clock and the multiplexer control signal and to generate an averaged multiplexer control signal; and
   a delay configured to receive a delay signal and the averaged multiplexer control signal and to generate the control signal.

16. The circuit of claim 13 wherein the averager comprises an accumulator configured to receive the reference clock and to generate an accumulated sum.

17. The circuit of claim 13 wherein the averager comprises a 16 bit carry look-ahead adder configured to receive a multiplexer control signal and an accumulated sum and to generate an adder output.

18. The circuit of claim 17 wherein the averager further comprises a divide by 256 circuit configured to receive the adder output and to generate an averaged multiplexer control signal.

19. The circuit of claim 13 wherein the averager comprises:
   an accumulator configured to receive the reference clock and to generate an accumulated sum;
   a 16 bit carry look-ahead adder configured to receive a multiplexer control signal and the accumulated sum and to generate an adder output; and
   a divide by 256 circuit configured to receive the adder output and to generate an averaged multiplexer control signal.

20. A circuit comprising:
a master delay-locked loop comprising:
   a phase detector configured to receive a reference clock and an internal clock output and to generate a phase detector output;
   control logic configured to receive the phase detector output and a delay input and to generate a control output, the control logic comprising:
      an up/down counter configured to receive an input from the phase detector and the reference clock and to generate a multiplexer control signal;
      an averager configured to receive an input from the reference clock and a multiplexer control signal and to generate an averaged multiplexer control signal, the averager comprising:
         an accumulator configured to receive the reference clock and to generate an accumulated sum;
         a 16 bit carry look-ahead adder configured to receive a multiplexer control signal and the accumulated sum and to generate an adder output; and
         a divide by 256 circuit configured to receive the adder output and to generate an averaged multiplexer control signal;
      a delay configured to receive a delay signal and an averaged multiplexer control signal and to generate the control signal;
   a clock splitter configured to receive the reference clock and to generate a differential clock output;
   a delay line configured to receive the differential clock output and to generate a delayed differential clock output; and
   a multiplexer configured to receive the delayed differential clock output and the control output and to generate the internal clock output; and
a slave delay-locked loop configured to receive the control output and a strobe input and to generate a delay locked loop output.

* * * * *